United States Patent [19]
Jelinek et al.

[11] Patent Number: 5,390,337
[45] Date of Patent: Feb. 14, 1995

[54] COMBINATION SURGE AND DIPLEX FILTER FOR CATV DISTRIBUTION SYSTEMS

[75] Inventors: Catherine W. Jelinek, Lawrenceville; Leo J. Thompson, Lilburn; Munther A. Al-Khalil, Duluth, all of Ga.

[73] Assignee: Scientific-Atlanta, Inc., Norcross, Ga.

[21] Appl. No.: 876,948

[22] Filed: May 1, 1992

[51] Int. Cl.⁶ .......................... H04H 1/00; H03H 7/46
[52] U.S. Cl. ........................... 455/5.1; 455/6.1; 348/12; 333/132
[58] Field of Search .............. 455/3.1, 5.1, 6.1; 358/86; 333/126, 129, 132, 136, 185, 181, 32; 348/12

[56] References Cited

U.S. PATENT DOCUMENTS

| | | |
|---|---|---|
| 3,806,813 | 4/1974 | Eller ............................... 455/5.1 |
| 4,760,357 | 7/1988 | Yamaguchi ...................... 333/185 |
| 5,194,947 | 3/1993 | Lowcock et al. ................. 358/86 |

Primary Examiner—Curtis Kuntz
Assistant Examiner—Thanh C. Le
Attorney, Agent, or Firm—Jones & Askew

[57] ABSTRACT

A combination surge and diplex filter is provided for a CATV distribution amplifier. In a first preferred implementation, an integrated surge and high pass filter section is provided when the CATV amplifier is used only in the forward direction. Provision is made for a plug-in low pass filter section which is matched to the high pass filter section. The plug-in low pass section is used to form a diplex filter if the reverse direction capability of the CATV system is required from the distribution amplifier. In a second preferred implementation, the integrated surge and high pass filter section is segmented into a surge filter segment which is designed as a divisible part of the high pass filter section. A plug-in module is then provided with a high pass filter segment having those components of the high pass filter section which were not necessary for surge protection and a low pass filter section matched to the high pass filter section. The plug-in module is utilized to form a diplex filter, if the reverse direction capability of the CATV system is required from the distribution amplifier.

23 Claims, 3 Drawing Sheets

COMBINATION SURGE AND DIPLEX FILTER FOR CATV DISTRIBUTION SYSTEMS

TECHNICAL FIELD

The invention pertains generally to CATV distribution amplifiers and systems and is more particularly directed to such distribution amplifiers which utilize surge filters in one-way CATV systems and diplex filters in two-way CATV systems.

BACKGROUND OF THE INVENTION

In community area or cable television (CATV) systems over long stretches of coaxial distribution runs, the broadband television signals are amplified at spaced locations by distribution amplifiers. The broadband television signals are transmitted over the distribution network from a headend in a forward direction to a plurality of subscribers, which is generally termed one-way system. However, more complex systems include a reverse signal path which is routed around the distribution amplifiers. The reverse channel is used for system control, messaging, pay per view events, monitoring, etc. To allow the forward signal path and the reverse signal path to use the same coaxial cable without interference, one diplex filter is used on the input of the forward signal amplifier and output of the reverse signal amplifier and another diplex filter is used on the output of the forward signal amplifier and input to the reverse signal amplifier. A diplex filter is a three-port passive device consisting of a high pass filter and a low pass filter joined at a common port. In this configuration the diplex filters are used with the distribution amplifier and reverse signal amplifier to separate the forward traveling high frequency broadband television channels and the reverse traveling low frequency data or monitoring channels. When a CATV system does not have a reverse path, surge filters may be provided before the input and after the output of the distribution amplifiers so as to protect them from high energy transients caused by line surges which can damage the amplifier.

CATV systems presently utilize a number of combinations of surge filters and diplex filters in their typical configurations. Some distribution amplifiers accommodate plug-in surge filters or diplex filters while other amplifiers have diplex filters built onto their printed circuit board. In the case of plug-in surge filters, generally only forward amplifiers for one-way systems are equipped with such filters. When these amplifiers are upgraded to a two-way system, the amplifier configuration is provided with a set of plug-in diplex filters to replace the surge filters. In other configurations, diplex filters are either built on or plugged into the amplifier printed circuit board and the amplifier is configured at the manufacturing point as a one-way (forward only) product.

There are several disadvantages to surge and diplex filters as they are presently provided for distribution amplifiers in CATV systems. Initially, surge filters are more costly than need be because they must be manufactured as plug-in assemblies to preserve the option of activating the reverse path of a particular system. Considerable cost is associated with interface hardware, a cover, and an additional printed circuit board. Present day plug-in surge filters are rendered useless when the system is upgraded to have a reverse path and are therefore wasted. Conversely, in products which do not offer plug-in surge filters, diplex filters are built on or plugged into the amplifier printed circuit board even when the amplifier is configured only as a forward only product. This results in an unnecessary cost burden when there are no plans to upgrade to a two-way system.

SUMMARY OF THE INVENTION

A combination surge and diplex filter for a CATV distribution amplifier is provided by the invention. In a first implementation, the combination filter includes an integrated high pass and surge filter section and a low pass filter section. The integrated surge and high pass filter section is designed to separately provide surge protection when used without the low pass section, and to be complementary in a diplex filter configuration when used with the low pass section.

The sections can be most advantageously used by providing the integrated surge and high pass filter on the printed circuit board of a distribution amplifier and providing a plug-in module for the low pass section. In this manner, an expensive plug-in arrangement for both the surge and diplex filter is avoided and the components of the surge filter are not wasted. The input impedance matching requirements of the surge filter are met by a shunt inductive reactance disposed across the input of the integrated high pass and surge filter section when the distribution amplifier is used in the forward direction. When the two-way system is used, the inductive reactance is disconnected.

In a second implementation, the combination filter includes an integrated high pass and surge filter section and a low pass filter section. The integrated high pass and surge filter section is further separated into segments including a surge filter segment which is designed to meet the surge filter requirement of the CATV distribution amplifier, and a high pass filter segment which is designed to be combined with the surge filter segment to meet the high pass filter requirements of a diplex filter for a two-way system.

The sections can be most advantageously used by providing the surge filter segment on the printed circuit board of a distribution amplifier and providing a plug-in board to contain both the high pass filter segment and the low pass filter section. This arrangement has the advantages of the first embodiment with the additional advantage that the surge filter segment can be made even more inexpensively. The input impedance requirements of the surge filter are met by a shunt inductive reactance disposed across the input of the surge filter segment when the distribution amplifier is used only in the forward direction. The inductive reactance is disconnected when the distribution amplifier is configured in a two-way system.

Therefore, it is an object of the invention to provide a combination surge and diplex filter for a CATV distribution amplifier.

It is a further object of the invention to provide an integrated high pass and surge filter section which will perform either as a surge filter or the high pass filter of a diplex filter for a CATV distribution amplifier.

It is yet another object of the invention to segment an integrated high pass and surge filter section into a surge filter segment and a high pass filter segment providing a high pass filter section of a diplex filter when combined with the surge filter segment.

BRIEF DESCRIPTION OF THE DRAWINGS

These and other objects, features and aspects of the invention will be more clearly understood and better described if the following detailed description is read in conjunction with the appended drawings wherein.

DETAILED DESCRIPTION OF THE PREFERRED EMBODIMENT

Figure 1A:
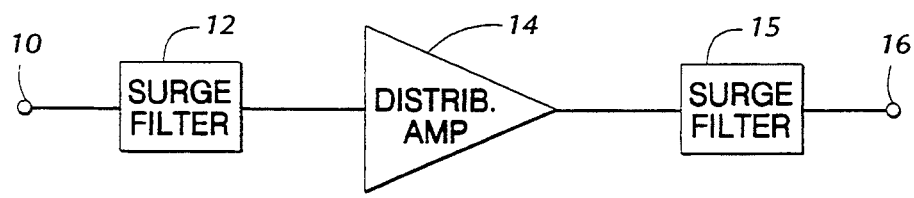
FIGS. 1A and 1B are system block diagrams of a distribution amplifier illustrating a one-way system with a forward only signaling path and a two-way system with a forward and reverse signaling path.
Figure 1B:
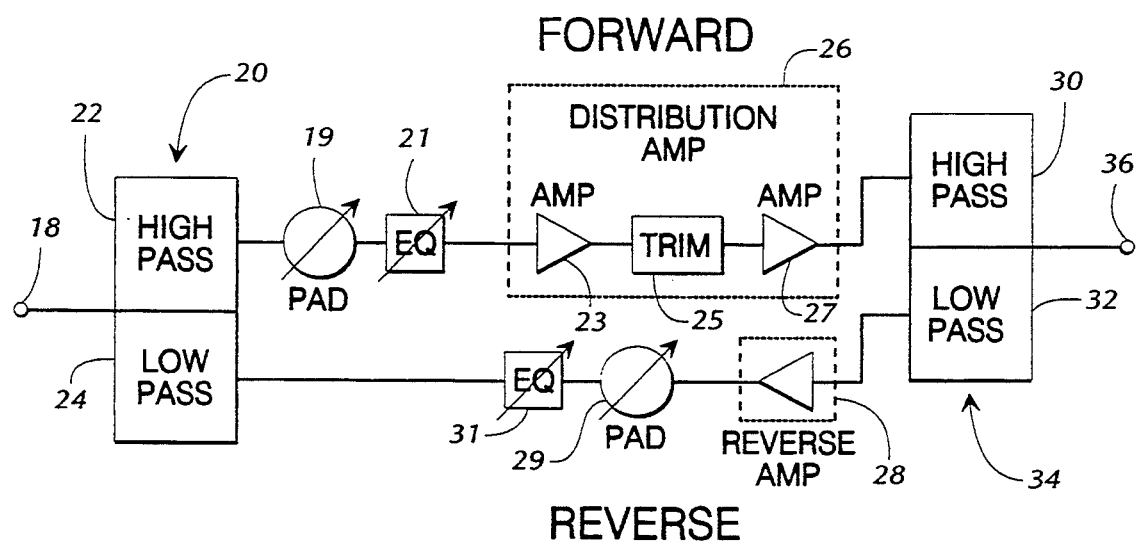

In FIGS. 1A and 1B there is shown two standard configurations for a distribution amplifier used in a CATV system. In the one-way system of FIG. 1A, broadband television signals come into an input terminal 10 of a distribution amplifier 14, are amplified, and are output on terminal 16 to the remaining portion of the coaxial cable distribution run. A first surge filter 12 is disposed between the terminal 10 and the input to the distribution amplifier 14 and a second surge filter 15 is disposed between the output of the distribution amplifier 14 and the output terminal 16. The surge filters 12 and 15 protect against line transients and other voltage surges which could affect the distribution amplifier performance.

FIG. 1B illustrates a two-way system having a forward direction where the broadband television signals are input at common terminal 18 and pass through the high pass filter 22 of a diplex filter 20 for input to a distribution amplifier 26. The amplifier 26 may have several stages 23 and 27 along with other circuitry, such as trim circuitry 25. Additionally, a resistive pad 19 and equalization circuit 21 may be provided in the amplification path of the distribution amplifier 26. The signals are amplified in the distribution amplifier 26 and then output to the remaining run of coaxial cable through the high pass filter 30 of a diplex filter 34 and common terminal 36. The high pass filters 22 and 30 are used to pass the broadband cable television signals and provide rejection for the low frequency signals which are used in the reverse path. Further, the high pass filters 22 and 30 have enough surge suppression capability to protect the input or the output of the distribution amplifier 26 and are similar in operation in this respect to surge filters 12 and 15 of the one-way system.

The reverse amplifier 28 receives low frequency signals over the coaxial cable which are input at terminal 36 and directed by the low pass filter 32 of a diplex filter 34 to the input of a reverse amplifier 28. A resistive pad 29 and equalization circuit 31 may also be included in the amplification path of the reverse amplifier. The reverse signals are amplified by the reverse amplifier 28 and then output through low pass filter 24 via terminal 18 to the coaxial cable. The low pass filters 24 and 32 provide rejection for the broadband television signals and a pass band for the reverse signals. In this way, a two-way communications system is provided whereby amplification for the broadband signals in the forward path and amplification for the reverse signals can occur without interference from the other.

Figure 2A:
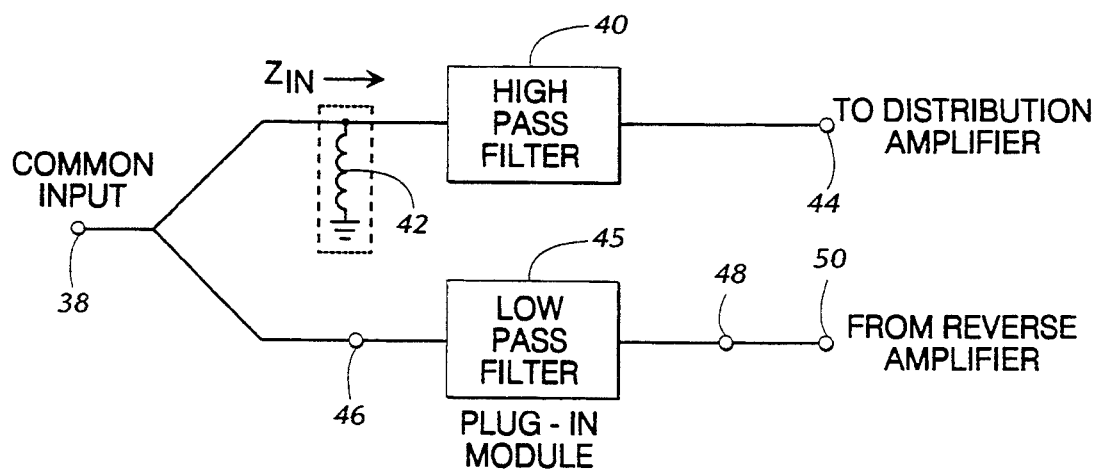
FIGS. 2A and 2B are detailed block diagrams of a first embodiment of a combination surge and diplex filter for the CATV distribution amplifier configurations illustrated in FIGS. 1A and 1B.

A first preferred embodiment of the invention is illustrated in FIG. 2A where a combination filter is shown adapted to replace the surge filter 12 in a one-way system and the diplex filter 20 in the two-way system. In the preferred embodiment, the invention provides a high pass filter 40 which is built onto the printed circuit board of the distribution amplifier 26 and provides an output via terminal 44. Also built onto the printed circuit board of the distribution amplifier 26 is a common input terminal 38 and provision for plug-in connections 46 and 48 which connect the common input to a reverse amplifier via terminal 50. A low pass filter 45 is provided as a plug-in module which can be detached from the plug-in connections 46 and 48. The high pass filter 40 and low pass filter 45 include components which are matched for the diplex filter application of a forward and reverse path system. The high pass filter 40 is further designed for and includes components actively providing surge protection for the input and output to the distribution amplifier 26.

In operation for a one-way system, the high pass filter 40 is built onto the printed circuit board of the distribution amplifier 26 and the low pass filter module 45 is not plugged in. Therefore, the high pass filter 40 acts as a surge filter to provide surge protection for the distribution amplifier 26 in the one-way system. In addition, impedance matching means, preferably a shunt inductive reactance 42, are provided at the input of the high pass filter 40 to match the input impedance $Z_{in}$ of the high pass filter to the common input terminal 38, which is a coaxial cable of nominally 75 Ohms. When the system is upgraded to a two-way system, the inductor 42 is disconnected and the low pass filter 45 is plugged into the plug-in connections 46 and 48 to provide a diplex filter function for which the high pass filter has already been designed. In the two-way system, when the inductor 42 is disconnected the common port impedance of the diplex filter becomes 75 Ohms. This is the value the original matching of the two filters sections is designed to yield for the diplex filter.

Figure 2B:
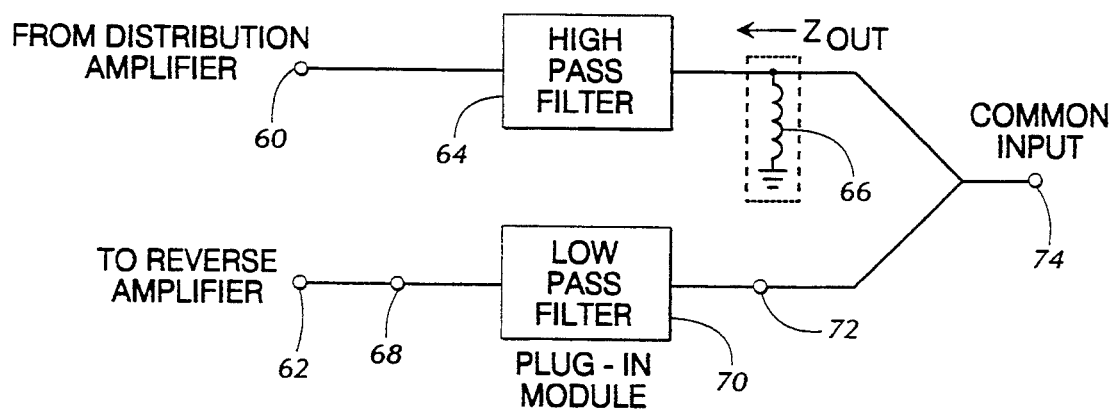

FIG. 2B illustrates a mirror image of the embodiment shown in FIG. 2A when it is used to replace the surge filter 15 in a one-way system or the diplex filter 34 in a two-way system. The components of each embodiment are identical. As can be seen from the illustration, the combination filter is bilateral and can be turned around to provide the same benefits for the output of the distribution amplifier 26 and input of the reverse amplifier 28 as it did for the input to the distribution amplifier and the output of the reverse amplifier. In a manner similar to that described previously, the output from the distribution amplifier 26 at terminal 60 passes through a high pass filter section 64 which is built onto the printed circuit board of the amplifier. The amplified and surge protected signal is then provided to the common output terminal 74 for further communication over the coaxial cable run. An inductor 66 is provided for impedance matching the output impedance $Z_{out}$ of the high pass filter 64 to the 75 Ohms of the coaxial cable. The printed circuit board of the distribution amplifier 26 has plug-in connectors 68 and 72 which are provided with a low pass filter plug-in module 70 when the one-way system is upgraded to a two-way system. The reverse signals enter the common output 74, are low pass filtered by the filter 70, and input to the reverse amplifier 28 through terminal 62.

While the invention is described for utilization with an amplifier, the block diagram of FIG. 1B makes it clear that other components, either alone or in combination with the amplifier, can benefit from the invention. The block diagram illustrates that different pads 19 and 29, and equalization circuits 21 and 31 can be utilized in separate forward and reverse paths. The invention is useful for providing surge protection for any component in a forward path and then providing a diplex filter for a two-way system which uses the same or a different component in the reverse path. The terms forward and reverse paths are also understood to include different frequency band signals traveling in the same direction, whether in the forward or reverse direction of a two-way system.

Figure 3:
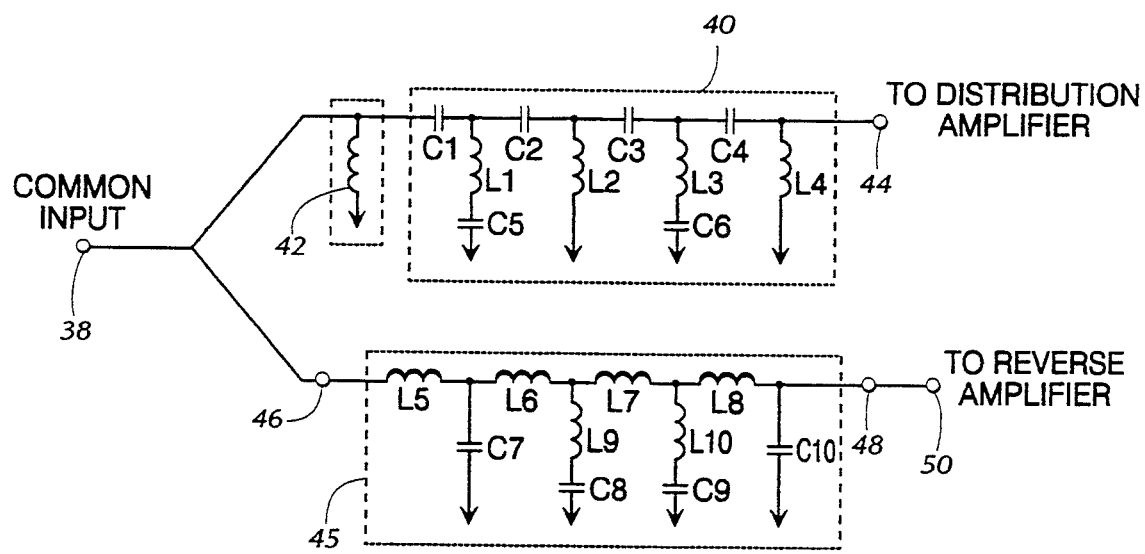
FIG. 3 is a detailed electrical schematic diagram of the combination surge and diplex filter illustrated in FIGS. 2A and 2B.

FIG. 3 is a detailed electrical schematic of a preferred circuit implementation for both of the embodiments shown in FIGS. 2A and 2B. The high pass filter section 40 is comprised of a plurality of capacitive and inductive reactance elements configured as a passive filter having multiple branches. Capacitors C1, C2, C3, C4; inductors L2, L4; inductor L1 with capacitor C5; and inductor L3 with capacitor C6 each form a separate branch of high pass filter 40. The low pass filter 45 is also a multi-branch passive inductive and capacitive reactance element filter. Inductors L5, L6, L7, L8; capacitors C7, C10; inductor L9 with capacitor C8; and inductor L10 with capacitor C9 each form a separate branch of the low pass filter 45.

In the CATV application described for the preferred implementation, the low pass and the high pass filters 40, 45 are 8th order pseudo-elliptic filters which are designed to provide a 75 Ohm impedance match from the common port while preserving an impedance match with the distribution and reverse amplifiers at the output ports when used in a diplex filter configuration. Because of the designed impedance match of the two filters when they are combined, the integrated high pass and surge filter when not used with the low pass section usually will not produce a 75 Ohm impedance match. Therefore, the inductor 42 is used to produce the impedance match needed for a nominal coaxial cable at either the common input terminal or common output terminal. In the preferred CATV application, the low pass filter 40 has a passband below of 30 MHz. and the high pass filter 45 has a passband above 46 MHz.

While the invention is described for a specific filter implementation, different order filters, other filter types (such as full elliptic or Chebyshev, or the like), or other filter design variations (such as dual circuits) could be used as equivalents for the embodiment illustrated.

Accordingly, the high cost of a plug-in device for a one-way system is avoided on one hand, and the surge filter components are not wasted on the other. The combination filter performs all the operations needed from both a surge and a diplex filter in the most efficient and inexpensive way for both systems. The configuration is also easily upgradeable in a field environment without jeopardizing performance, and at minimal cost.

Figure 4:
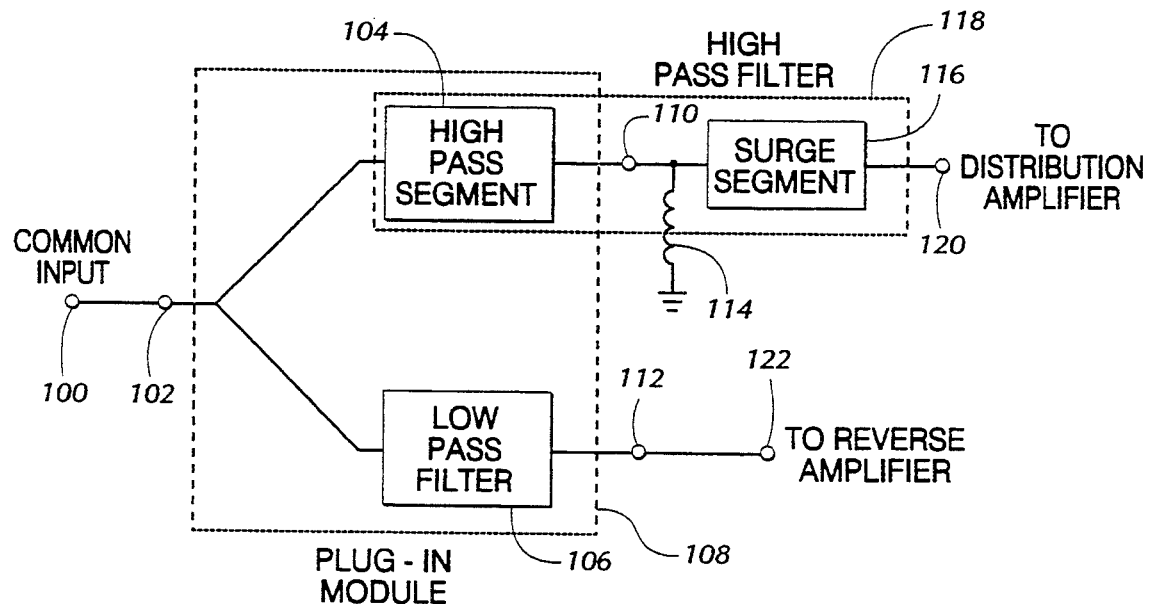
FIG. 4 is a detailed block diagram of a second embodiment of a combination surge and diplex filter for the CATV distribution amplifiers illustrated in FIGS. 1A and 2B.

FIG. 4 illustrates a second preferred embodiment of the invention. In the embodiment disclosed in FIGS. 2A and 2B, there are additional elements in the one-way system which are not necessary for surge protection. However, these elements are needed for correct operation in a two-way system and it would be advantageous to provide them only for this form of operation. The embodiment illustrated in FIG. 4 accomplishes this object. The combination filter is shown as a high pass filter segment 104 connected to a surge filter segment 116 to form a high pass filter 118. In addition, to the high pass filter 118, the combination filter includes a low pass filter 106 similar to the low pass filter of the first embodiment. The surge filter segment 116 is preferably built onto the printed circuit board of the distribution amplifier 26. The high pass filter segment 104 and low pass filter 106 are built onto a plug-in module 108 which plugs into plug-in connectors 102, 110 and 112.

In operation in a one-way system, a coaxial cable is connected to the common input 100 and the plug-in connectors 102 and 110 are jumpered together. The surge filter segment 116 is then disposed between the common input 100 and the input of the distribution amplifier 26 at terminal 120. An impedance matching means, inductive reactance 114, is provided at the input of the surge filter segment 116 to produce an impedance match to the nominal 75 Ohms of the input coaxial cable. When the system is upgraded to a two-way system, the jumper between plug-in connectors 102 and 110 is removed, the inductor 114 is disconnected, and the plug-in module 108 is plugged into the plug-in connectors 102, 110 and 112. The plug-in module contains the high pass filter segment 104 which with the surge filter segment 116 performs a high pass filter function for one leg of the common input 100. Another leg from the common input 100 passes through the low pass filter 106 and plug-in terminal 112 directly to terminal 122 which connects to the reverse amplifier 28. The above describes the use of the invention for the input side of the one-way and two-way systems illustrated in FIGS. 1A and 1B. For the output side, the implementation shown in FIG. 4 is reversed (similar to that in FIG. 2B for the first embodiment). Both input and output implementations provide surge protection in a one-way system and surge protection and diplex filter operation in a two-way system.

Figure 5:
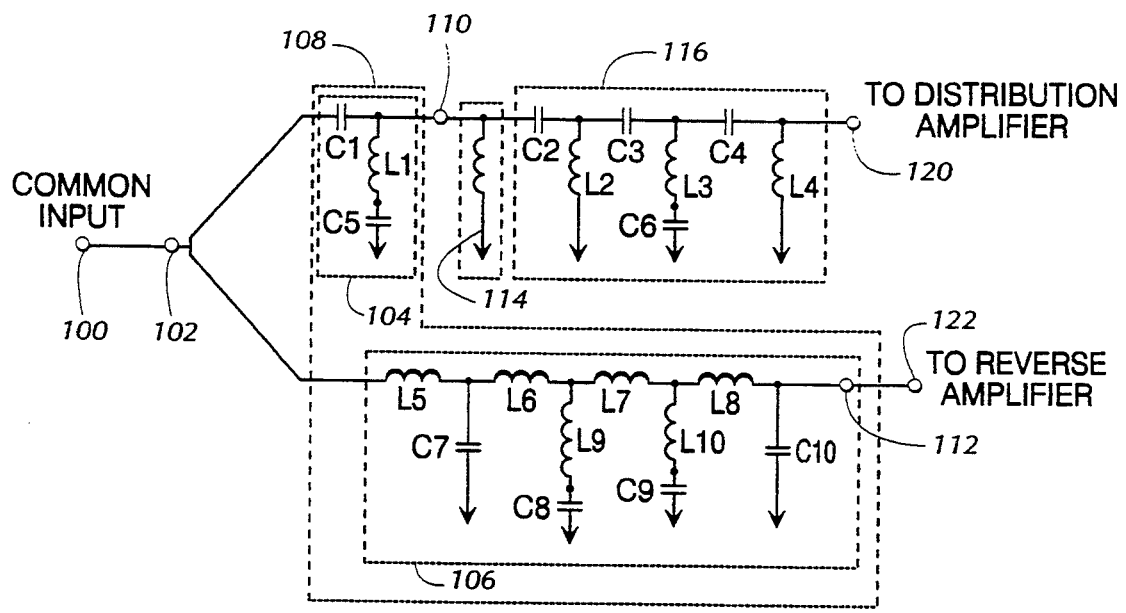
FIG. 5 is a detailed electrical schematic of the combination surge and diplex filter illustrated in FIG. 4.

With respect to FIG. 5, a detailed electrical schematic of the second preferred implementation of the combined filter illustrated in FIG. 4 will be more fully described. The design of the high pass filter and low pass filter for diplex filter operation is similar to that previously described for FIG. 3. From the drawings, a comparison of FIGS. 3 and 5 will show that the same configuration of filters is used for the high pass filter and the low pass filter. Each filter is an 8th order pseudo elliptic design having a plurality of capacitive and inductive reactances.

A segment of the high pass filter comprising capacitor C1 and capacitor C5 with inductor L1 has been moved to the plug-in module 108. It is evident by inspection that the high pass filter and surge filter combination has two finite zero pairs (frequencies at which there is maximum attenuation). To be able to split the high pass filter into two identifiable sections of components, while still performing the surge operation and maintaining the match between the low pass and the high pass filter sections for diplex operation, is difficult. The invention accomplishes this objective by isolating the finite zero pair which is represented by the inductor L3 and the capacitor C6. This zero pair is configured to provide adequate surge suppression when only six branches of the filter 116 are used independently. The finite zero pair of the high pass filter section 104, comprising inductor L1 and capacitor C5, is then designed to complement the first zero pair and produce a high pass filter when combined with the surge filter 116 which is matched to the low pass filter 106. This permits a segmentation of the surge filter segment and high pass filter segment into easily implementable components in a facile manner.

While there has been shown and described the preferred embodiments of the invention, it will be evident to those skilled in the art that various modifications may be made thereto without departing from the spirit and scope of the invention as set forth in the appended claims. For example, the preferred embodiment has been described with respect to a CATV distribution amplifier. It is equally evident that the invention is applicable to any apparatus for RF signals where a one-way and two-way communication system are envisioned. Therefore, the term amplifier includes all CATV type amplification apparatus including, without limitation, trunk amplifiers, line extender amplifiers, bridger amplifiers, optical bridger amplifiers, and headend amplifiers. In addition, all communications systems are envisioned including, without limitation, CATV, telephone, data networks, personal communication networks, or the like.

What is claimed is:

1. A combination filter for a CATV distribution amplifier operative to provide a surge filter function in a one-way communications system and a diplex filter function in a two-way communications system, said combination filter comprising:
   an integrated high pass and surge filter section built onto a printed circuit board;
   a low pass filter section detachably mounted to said printed circuit board as a plug in module;
   wherein said integrated high pass and surge filter section and said low pass filter section are matched to form a diplex filter;
   wherein when said combination filter is used in said one-way communications system, said low pass filter section is not mounted onto said printed circuit board; and
   wherein when said combination filter is used in said two-way communications system, said low pass filter section is mounted onto said printed circuit board.

2. The combination filter for a CATV distribution amplifier as set forth in claim 1 wherein:
   said integrated high pass and surge filter section performs a surge filter function when not combined with said low pass filter section; and
   said integrated high pass and surge filter section performs a high pass filter function when combined with said low pass filter section.

3. The combination filter for a CATV distribution amplifier as set forth in claim 2 wherein:
   said integrated high pass and surge filter section is built onto the same printed circuit board as the CATV amplifier.

4. The combination filter as in claim 1, wherein said integrated high pass and surge filter section comprises:
   a high pass filter; and
   a disconnectable shunt inductive reactance;
   wherein when said combination filter is used in said one-way communications system, said disconnectable shunt inductive reactance is connected to said high pass filter; and
   wherein when said combination filter is used in said two-way communications system, said disconnectable shunt inductive reactance is not connected to said high pass filter.

5. A combination filter for a CATV distribution amplifier operative to provide a surge filter function in a one-way communications system and a diplex filter function in a two-way communications system, comprising:
   a mounting surface;
   a common terminal;
   a plurality of connecting terminals;
   a high pass filter built onto said mounting surface, said high pass filter having an input connected to said common terminal and an output connected to one of said plurality of connecting terminals;
   a first terminal on said mounting surface connected to said common terminal;
   a second terminal on said mounting surface connected to another one of said plurality of connecting terminals;
   said first and said second terminals on said mounting surface comprising a plug-in connection for receiving a selectably removable low pass filter module for use in a two-way communications system;
   a third terminal on said mounting surface connected to said high pass filter input;
   a fourth terminal on said mounting surface connected to ground;
   said third and said fourth terminals on said mounting surface comprising a connection for a disconnectable shunt inductive reactance for use in a one-way communication system.

6. The combination filter as in claim 5, wherein said mounting surface is a printed circuit board.

7. The combination filter as in claim 5, wherein when said filter is used in a two-way communication system, said low pass filter module is plugged into said plug-in connection and said shunt inductive reactance is not connected.

8. The combination filter as in claim 5, wherein when said filter is used in a one-way communication system, said low pass filter module is not plugged into said plug in connection and said shunt inductive reactance is connected.

9. The combination filter as in claim 5, wherein one of said plurality of connecting terminals is connected to a distribution amplifier in said one-way communications system and in said two-way communications system.

10. The combination filter as in claim 5, wherein said another one of said connecting terminals is connected to a reverse amplifier in said two-way communications system.

11. A combination filter for a CATV distribution amplifier operative to provide a surge filter function in a one-way communications system and a diplex filter function in a two-way communications system, comprising:
   a mounting surface;
   a common terminal;
   a plurality of connecting terminals;
   a surge filter segment built onto said mounting surface, said surge filter segment having an input and an output, said output connected to one of said plurality of connecting terminals;
   a first terminal on said mounting surface connected to said common terminal;

a second terminal on said mounting surface connected to one of said plurality of connecting terminals;

a third terminal on said mounting surface connected to said surge filter segment input;

said first, said second, and said third terminals on said mounting surface comprising a plug-in connection for receiving a selectably removable filter module for use in a two-way communications system;

a fourth terminal on said mounting surface connected to said surge filter segment input;

a fifth terminal on said mounting surface connected to ground;

said fourth and said fifth terminals on said mounting surface comprising a connection for a disconnectable shunt inductive reactance for use in a one-way communication system.

12. The combination filter as in claim 11, wherein said mounting surface is a printed circuit board.

13. The combination filter as in claim 11, wherein when said filter is used in a two-way communication system, said filter module is plugged into said plug-in connection and said shunt inductive reactance is not connected.

14. The combination filter as in claim 11, wherein when said filter is used in a one-way communication system, said filter module is not plugged into said plug-in connection and said shunt inductive reactance is connected.

15. The combination filter as in claim 11, wherein said removable filter module comprises a high pass filter segment for connection between said first terminal and said third terminal.

16. The combination filter as in claim 11, wherein said removable filter module comprises a low pass filter connected between said first terminal and said second terminal.

17. The combination filter as in claim 11, wherein said removable filter module comprises a high pass filter segment for connection between said first terminal and said third terminal, and a low pass filter connected between said first terminal and said second terminal.

18. The combination filter as in claim 11, wherein said one of said connecting terminals is connected to a distribution amplifier in said one-way communications system and in said two-way communications system.

19. The combination filter as in claim 11, wherein said another one of said connecting terminals is connected to a reverse amplifier in said two-way communications system.

20. A combination filter for a CATV distribution amplifier operative to provide a surge filter function in a one-way communications system and a diplex filter function in a two-way communications system, said combination filter comprising:

a high pass filter segment and a surge filter segment, said surge filter segment built onto a printed circuit board;

a detachable filter module detachably mounted to said printed circuit board as a plug-in module, said detachable filter module including said high pass filter segment and a low pass filter section;

wherein said high pass filter segment, said surge filter segment, and said low pass filter segment are matched to form a diplex filter;

wherein when said combination filter is used in said two-way communications system, said detachable filter module is mounted to said printed circuit board; and wherein when said combination filter is used in said one-way communications system, said detachable filter module is not mounted to said printed circuit board.

21. The combination filter for a CATV distribution amplifier as set forth in claim 20 wherein:

said surge filter segment performs a surge filter function when not combined with said high pass filter segment and said low pass filter section; and said surge filter segment performs as a high pass filter function when combined with said high pass filter segment.

22. The combination filter for a CATV distribution amplifier as set forth in claim 21 wherein:

said surge filter segment is built on the same printed circuit board as the CATV amplifier.

23. A combination filter as in claim 20, wherein said high pass filter segment and said surge filter segment comprises:

a high pass filter; and a disconnectable shunt inductive reactance;

wherein when said combination filter is used in said one-way communications system, said disconnectable shunt inductive reactance is connected to said high pass filter; and wherein when said combination filter is used in said two-way communications system, said disconnectable shunt inductive reactance is not connected to said high pass filter.

* * * * *